US006914916B2

(12) United States Patent
Pezeshki et al.

(10) Patent No.: US 6,914,916 B2
(45) Date of Patent: Jul. 5, 2005

(54) TUNABLE CONTROLLED LASER ARRAY

(75) Inventors: Bardia Pezeshki, Redwood City, CA (US); John Heanue, Fremont, CA (US); Ed Vail, Fremont, CA (US)

(73) Assignee: Santur Corporation, Fremont, CA (US)

( * ) Notice: Subject to any disclaimer, the term of this patent is extended or adjusted under 35 U.S.C. 154(b) by 571 days.

(21) Appl. No.: 10/000,142

(22) Filed: Oct. 30, 2001

(65) Prior Publication Data

US 2002/0085594 A1 Jul. 4, 2002

Related U.S. Application Data

(60) Provisional application No. 60/307,559, filed on Jul. 24, 2001, provisional application No. 60/244,738, filed on Oct. 31, 2000, provisional application No. 60/244,689, filed on Oct. 30, 2000, and provisional application No. 60/244,645, filed on Oct. 30, 2000.

(51) Int. Cl.[7] .............................. H01S 3/121; H01S 3/10
(52) U.S. Cl. ................................ 372/15; 372/14; 372/20
(58) Field of Search ........................ 372/6, 9, 14–20, 372/23

(56) References Cited

U.S. PATENT DOCUMENTS

| 3,924,937 A | 12/1975 | Munroe et al. |
| 4,317,611 A | 3/1982 | Petersen |
| 4,359,773 A | 11/1982 | Swartz et al. |

(Continued)

FOREIGN PATENT DOCUMENTS

| EP | 0924821 A1 | 6/1999 |
| FR | 2805092 | 8/2001 |
| JP | 56060088 | 5/1981 |
| JP | 11326707 | 11/1999 |
| JP | 2002246699 | 8/2002 |
| WO | WO 95/13638 | 5/1995 |
| WO | WO 02/13343 A2 | 2/2002 |
| WO | WO 02/37069 A1 | 5/2002 |
| WO | WO 02/37621 A2 | 5/2002 |
| WO | WO 02/058197 A2 | 7/2002 |
| WO | WO 02/013343 A3 | 7/2003 |

OTHER PUBLICATIONS

"Broadband Lightwave Sources and System", Gayton Photonics Ltd., http://www.infowin.org/ACTS/RUS/PROJECTS/ac065.htm, printed Oct. 17, 2000 (4 pages).
Dellunde, Jaume, "Laser diodes", http://www.geocities.com/jdellund/receng.htm, printed Aug. 8, 2001 (4 pages).
Hunter, D.K., et al., "Guided wave optical switch architectures. Part 1. Space switching", International Journal of Optoelectronics, vol. 9, No. 6, 1994 (pp. 477–487).

(Continued)

*Primary Examiner*—Minsun Oh Harvey
*Assistant Examiner*—Phillip Nguyen
(74) *Attorney, Agent, or Firm*—Christie, Parker & Hale LLP

(57) ABSTRACT

A semiconductor laser capable of emitting in any one of standard communication wavelengths is of great practical value. To this end, a single semiconductor chip is fabricated on which many different distributed feedback (DFB) lasers are integrated. The device parameters of the different DFB lasers are varied such that each laser emits at a different wavelength. In addition a micro-mechanical optical element is packaged with the laser array, such that the position of the optical element controls which laser stripe is coupled to the output fiber. The micro-mechanical element or switch in various embodiments is a sliding waveguide, a movable lens, or a mirror that tilts. By selecting the particular DFB laser, controlling the temperature to fine tune the wavelength, and adjusting the position of the micro-mechanical optical element, the output wavelength is set to one of many communication wavelengths.

35 Claims, 16 Drawing Sheets

U.S. PATENT DOCUMENTS

| | | | | |
|---|---|---|---|---|
| 4,474,422 | A | * 10/1984 | Kitamura | 359/204 |
| 4,498,730 | A | 2/1985 | Tanaka et al. | |
| 4,768,184 | A | * 8/1988 | Reno | 369/112.28 |
| 4,820,899 | A | 4/1989 | Hikima et al. | |
| 4,995,050 | A | * 2/1991 | Waarts et al. | 372/95 |
| 5,136,598 | A | 8/1992 | Weller et al. | |
| 5,163,058 | A | * 11/1992 | Farries et al. | 372/6 |
| 5,212,572 | A | * 5/1993 | Krantz et al. | 369/112.1 |
| 5,220,463 | A | * 6/1993 | Edelstein et al. | 359/857 |
| 5,228,050 | A | 7/1993 | LaCourse et al. | |
| 5,274,489 | A | 12/1993 | Smith et al. | |
| 5,283,796 | A | 2/1994 | Fink | |
| 5,289,485 | A | 2/1994 | Mooradian | |
| 5,291,502 | A | 3/1994 | Pezeshki et al. | |
| 5,325,386 | A | 6/1994 | Jewell et al. | |
| 5,369,661 | A | * 11/1994 | Yamaguchi et al. | 372/69 |
| 5,378,330 | A | 1/1995 | Li et al. | |
| 5,379,310 | A | * 1/1995 | Papen et al. | 372/23 |
| 5,420,416 | A | 5/1995 | Iida et al. | |
| 5,468,975 | A | 11/1995 | Valster | |
| 5,491,576 | A | 2/1996 | Bergano | |
| 5,504,609 | A | 4/1996 | Alexander et al. | |
| 5,519,487 | A | 5/1996 | Atwood et al. | |
| 5,550,850 | A | 8/1996 | Lee et al. | |
| 5,612,968 | A | 3/1997 | Zah | |
| 5,629,790 | A | 5/1997 | Neukermans et al. | |
| 5,650,612 | A | 7/1997 | Criswell et al. | |
| 5,677,970 | A | * 10/1997 | Nashimoto | 385/7 |
| 5,699,589 | A | 12/1997 | Ripley et al. | |
| 5,715,047 | A | 2/1998 | Adamovsky | |
| 5,771,253 | A | 6/1998 | Chang-Hasnain et al. | |
| 5,773,345 | A | * 6/1998 | Ota | 438/286 |
| 5,777,763 | A | 7/1998 | Tomlinson, III | |
| 5,784,183 | A | 7/1998 | Aoki et al. | |
| 5,784,507 | A | 7/1998 | Holm-Kennedy et al. | |
| 5,798,859 | A | 8/1998 | Colbourne et al. | |
| 5,808,986 | A | 9/1998 | Jewell et al. | |
| 5,825,792 | A | 10/1998 | Villeneuve et al. | |
| 5,882,468 | A | 3/1999 | Crockett et al. | |
| 5,930,045 | A | 7/1999 | Shirasaki | |
| 5,949,544 | A | 9/1999 | Manning | |
| 5,953,359 | A | 9/1999 | Yamaguchi et al. | |
| 5,959,750 | A | 9/1999 | Eskildsen et al. | |
| 5,977,567 | A | 11/1999 | Verdiell | |
| 5,993,544 | A | 11/1999 | Knauss et al. | |
| 5,999,303 | A | 12/1999 | Drake | |
| 5,999,545 | A | 12/1999 | Jeon et al. | |
| 6,028,722 | A | * 2/2000 | Lang | 359/834 |
| 6,044,705 | A | 4/2000 | Neukermans et al. | |
| 6,049,554 | A | 4/2000 | Lang et al. | |
| 6,078,394 | A | 6/2000 | Wood | |
| 6,091,537 | A | 7/2000 | Sun et al. | |
| 6,121,983 | A | * 9/2000 | Fork et al. | 347/134 |
| 6,133,615 | A | 10/2000 | Guckel et al. | |
| 6,175,668 | B1 | 1/2001 | Borrelli et al. | |
| 6,183,092 | B1 | 2/2001 | Troyer | |
| 6,192,062 | B1 | * 2/2001 | Sanchez-Rubio et al. | 372/92 |
| 6,201,629 | B1 | 3/2001 | McClelland et al. | |
| 6,212,151 | B1 | 4/2001 | Heanue et al. | |
| 6,227,724 | B1 | 5/2001 | Verdiell | |
| 6,236,666 | B1 | * 5/2001 | Mirov et al. | 372/23 |
| 6,256,328 | B1 | 7/2001 | Delfyett et al. | |
| 6,275,315 | B1 | 8/2001 | Park et al. | |
| 6,275,317 | B1 | 8/2001 | Doerr et al. | |
| 6,316,764 | B2 | 11/2001 | Heffner et al. | |
| 6,327,063 | B1 | 12/2001 | Rockwell | |
| 6,350,064 | B2 | 2/2002 | Mitsuda et al. | |
| 6,352,376 | B2 | 3/2002 | Walters et al. | |
| 6,361,672 | B1 | * 3/2002 | Zhu et al. | 204/603 |
| 6,400,513 | B1 | * 6/2002 | Southwell | 359/641 |
| 6,411,424 | B1 | 6/2002 | Raj | |
| 6,434,291 | B1 | 8/2002 | Kessler et al. | |
| 6,445,514 | B1 | 9/2002 | Ohnstein et al. | |
| 6,462,883 | B1 | * 10/2002 | Wang et al. | 359/641 |
| 6,483,969 | B1 | 11/2002 | Yap et al. | |
| 6,501,782 | B1 | * 12/2002 | Farmer | 372/92 |
| 6,516,017 | B1 | 2/2003 | Matsumoto | |
| 6,522,793 | B1 | 2/2003 | Szilagyi et al. | |
| 6,529,542 | B1 | * 3/2003 | Karlsen et al. | 372/108 |
| 6,665,471 | B1 | * 12/2003 | Farmer et al. | 385/37 |
| 6,693,926 | B2 | * 2/2004 | Cayrefourcq et al. | 372/14 |
| 6,735,357 | B2 | * 5/2004 | Jensen | 385/24 |
| 2001/0017876 | A1 | 8/2001 | Kner et al. | |
| 2001/0036206 | A1 | 11/2001 | Jerman et al. | |
| 2001/0050928 | A1 | 12/2001 | Cayrefourcq et al. | |
| 2002/0064192 | A1 | 5/2002 | Missey et al. | |
| 2002/0076480 | A1 | 6/2002 | Hsieh et al. | |

OTHER PUBLICATIONS

Solgaard, O., et al., "Optoelectronic Packaging Using Silicon Surface-Micromachined Alignment Mirrors", IEEE Photonics Technology Letters, vol. 7, No. 1, 1995 (pp. 41–43) (4 pages total).

Li, G.P., et al., "16-Wavelength Gain-Coupled DFB Laser Array with Fine Tunability", IEEE Photonics Technology Letters, vol. 8, No. 1, Jan. 1996 (pp. 22–24).

Gordon, C., "Hybrid Mode-Locked DBR-laser", Multidisciplinary Optical Switching Technology Center, http://www.ece.ucsb.edu/MOST/33.html, (last updated Jan. 22, 1996), printed Aug. 5, 2001 (3 pages).

Daneman, M. J., et al., "Laser-to-Fiber Coupling Module Using a Micromachined Alignment Mirror", IEEE Photonics Technology Letters, vol. 8, No. 3, Mar. 1996 (pp. 396–398).

Wu, M., "Micromachining for Optical and Optoelectronic Systems", Proceedings of the IEEE, vol. 85, No. 11, Nov. 1997 (pp. 1833, 1943–1952).

Jacques, S., "Phase conjugate mirror and diffraction grating yield stable, collimated, coherent, high-power diode laser.", Oregon Medical Laser Center Newsletter, http://omlc.ogi.edu/news/dec97/pclaser.html, printed Apr. 9, 2001, (2 pages).

Shirasaki, M., "Chromatic-Dispersion Compensator Using Virtually Imaged Phased Array", IEEE Photonics Technology Letters, vol. 9, No. 12, Dec. 1997 (pp. 1598–1600).

Kudo, K., et al., "Multiwavelength microarray semiconductor lasers", Electronics Letters, vol. 34, No. 21, Oct. 15, 1998, (pp. 2037–2039).

Kopka, P., et al., "Bistable 2×2 and Multistable 1×4 Micromechanical Fibre-optic Switches on Silicon", Micro Opto Electro Mechanical Systems, MOEMS 1999 (4 pages).

"(BW)(OH-MARCONI-COMM-2) Marconi Communications Announces World-Beating Commercial Tuneable Laser at Telecom '99", Press Release, http://www.businesswire.com/cgi-bin/ts_headline.sh?/bw.101199/192842212, Oct. 11, 1999, printed Oct. 17, 2000 (2 pages).

Maluf, N., "Optical switches", An Introduction to Microelectromechanical Systems Engineering, 2000, pp. 187–190 (3 pages).

Nakano, H., "Technological Trends of Optical Communication Devices for DWDM", NEC Device Technology International 2000, No. 59 (5 pages).

Liu, F., et al., "Cost-effective wavelength selectable light source using DFB fibre laser array", Electronics Letters, vol. 36, No. 7, Mar. 30, 2000, pp. 620–621, (3 pages).

Hunwicks, A., "Advancing the Optical Component", http://www.telecoms-mag.com/issues/200004/tci/advancing-.html, Apr. 2000, printed Oct. 17, 2000 (6 pages).

Pezeshki, B., et al., "12nm tunable WDM source using an integrated laser array", Electronics Letters, vol. 36, No. 9, Apr. 27, 2000 (pp. 788–789).

Howe, P., "Light fantastic", digitalMASS at Boston.com, http://digitalmass.boston.com/news/daily/05/22/light_fantastic.html, printed Oct. 17, 2000 (5 pages).

Silverman, S., "Vcs beam big bucks at optics upstarts", Redherring.com Oct. 9, 2000, http://www.redherring.com/vc/2000/1009/vc-optics100900.html?id=yahoo, printed Oct. 10, 2000 (5 pages).

International Search Report for International Application PCT/US02/25365, filed Aug. 8, 2002, mailed Feb. 13, 2003 (4 pages).

International Search Report dated Nov. 1, 2002 for International Application No. PCT/US01/45691 and mailed Jan. 6, 2003 (3 pages).

International Search Report for International Application No. PCT/US02/25364, filed Aug. 8, 2002, mailed Feb. 13, 2003 (4 pages).

International Search Report dated Jan. 21, 2003 for International Application No. PCT/US01/24969 and mailed Jan. 28, 2003 (3 pages).

* cited by examiner

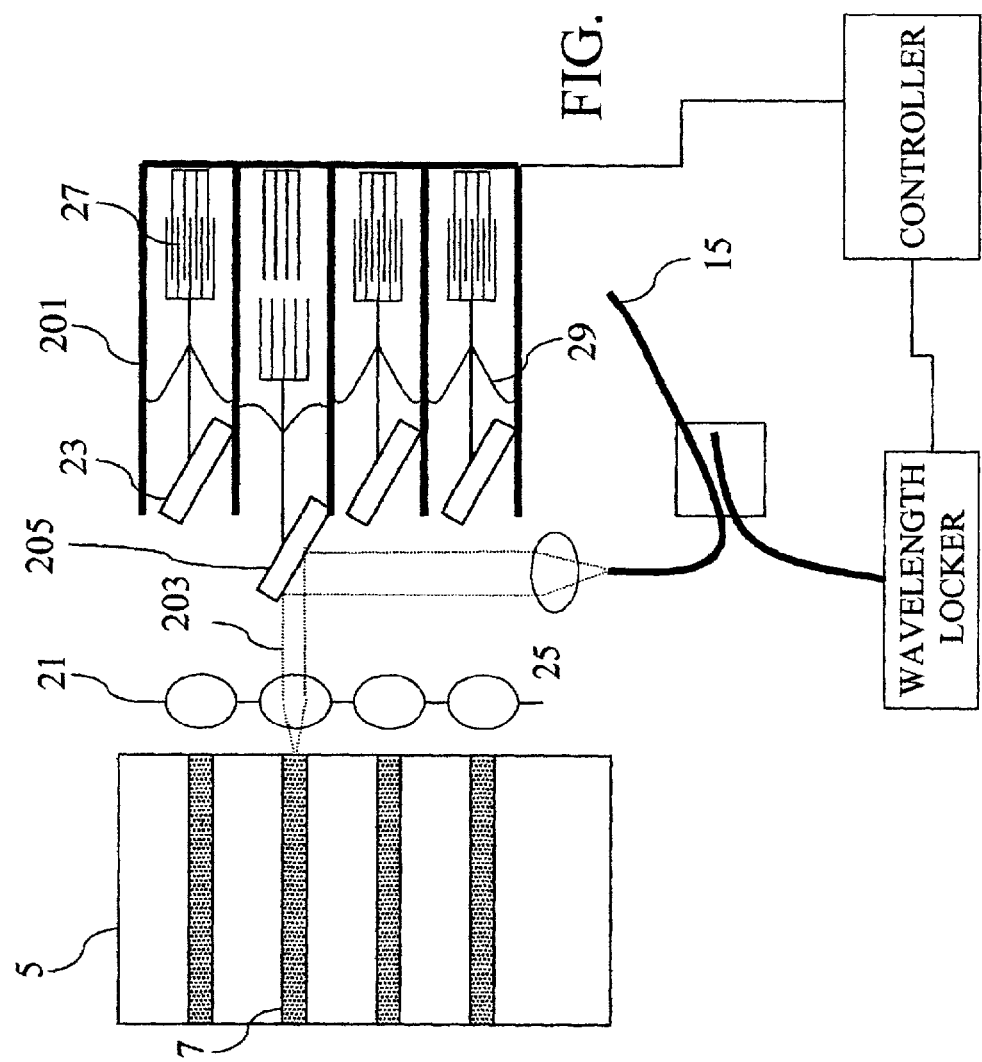

TUNABLE CONTROLLED LASER ARRAY

CROSS-REFERENCE TO RELATED APPLICATIONS

This application claims the benefit of U.S. provisional application numbers 60/244,689 filed Oct. 30, 2000, 60/244, 645 filed Oct. 30, 2000, 60/244,738 filed Oct. 31, 2000 and 60/307,559 filed Jul. 24, 2001 which are hereby incorporated by reference as if set forth in full herein.

BACKGROUND

The present invention relates generally to lasers and in particular to tunable lasers used in telecommunications systems.

Lasers are widely used in high speed data communication devices such as multi-wavelength fiber optic communication links. In wavelength division multiplexed (WDM) communication links, the transmission of data via an optical fiber is increased by using multiple optical signals with different wavelengths simultaneously. Each optical signal is capable of carrying a different data signal.

Conventional optical sources for such links are often fixed wavelength distributed feedback (DFB) lasers. DFB lasers contain a waveguiding structure fabricated in an active semiconductor, where a continuous grating runs through the device and determines the wavelength of operation. In general these devices are high power, have excellent single wavelength characteristics (side-mode suppression ratio), and are extremely stable over time.

DFB lasers, however, generally operate at fixed wavelengths, and are very difficult to tune to other wavelengths. Though slight changes in wavelength can be realized via thermal effects, tuning DFB lasers by large amounts, to cover a large part of a communication band is often not possible. As such, in order to provide a large, gradual and varied tuning range, generally a large number of DFB lasers fixed at different wavelengths are stocked, along with multiple spare DFB lasers. However, system reconfiguration becomes more complex in order to accommodate multiple DFB lasers.

To overcome these shortcomings, a great deal of effort has been expended on fabricating tunable laser diodes. Unfortunately, delivering the performance of fixed wavelength DFB lasers with the added benefit of wide tunability at an appropriate cost is not easily accomplished. There are fundamental reasons why tunability is such a challenge. In lasers with precise wavelength control, an optical element governs the wavelength, and to tune such a device, the optical path length of the controlling optical element is varied. Varying the optical path length of the controlling element significantly induces other complexities that degrade the performance of the laser.

BRIEF SUMMARY OF THE INVENTION

The present invention relates to providing one of many transmission wavelengths from a simple compact package, useful for multiple wavelength communication in fiber optic links. In one embodiment the present invention comprises an optical transmission apparatus. The optical transmission apparatus comprises an array of lasers, an array of mirrors, and an optical output. Each mirror in the array of mirrors is movable such that light from a laser from the array of lasers directed to the mirror is directed to the optical output.

In a further embodiment the present invention comprises an optical transmission apparatus. The optical transmission apparatus comprises an array of lasers, a lens collimating light from the laser in the array of lasers, and an optical output. The invention further comprises a movable mirror movable to receive light collimated by the lens from any of a plurality of lasers in the array of lasers, the mirror reflecting the light back to the lens which passes the light to the optical output. In a further embodiment the invention comprises a mirror positionable to reflect light that normal incidents from any one of a plurality of lasers in the arrays of lasers to the optical element.

These and other aspects of the present invention will be more readily understood when considered with respect to the following description and accompanying figures.

BRIEF DESCRIPTION OF THE DRAWINGS

FIG. 2A illustrates one embodiment of an optical transmission apparatus of FIG. 2 having a servo control loop;

DETAILED DESCRIPTION

Figure 1:
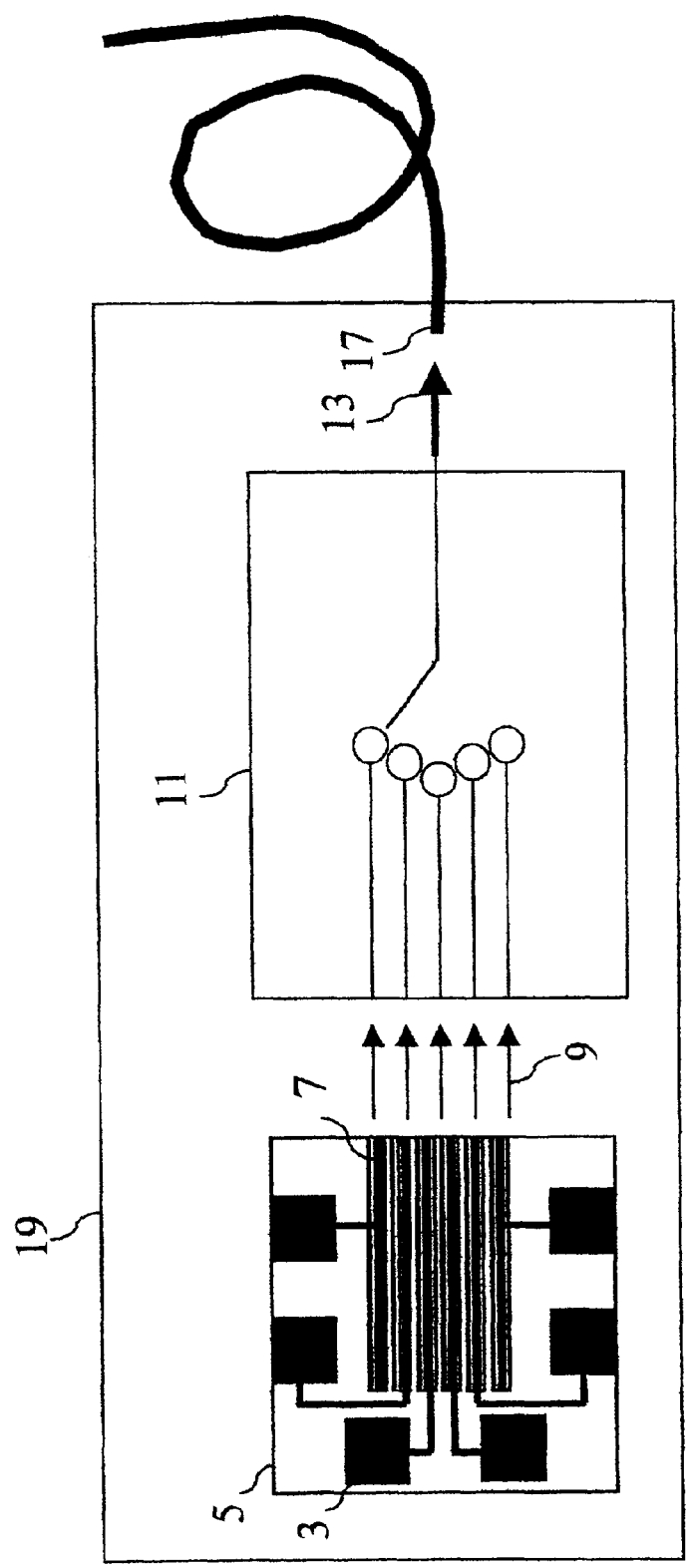
FIG. 1 illustrates one embodiment of an optical transmission apparatus having an individually addressable multi-wavelength laser array directly coupled to a 1:N micro-mechanical switch.

In the following figures, parts corresponding to those already represented and described in previous figures that are the same or equivalent parts are indicated by the same reference numerals.

FIG. 1 shows an array of single wavelength lasers, such as distributed feedback (DFB) lasers, on a semiconductor substrate. Although each of the lasers is a single wavelength, not all of the lasers operate at the same wavelength. Indeed in a preferred embodiment, the lasers each output light at different wavelengths.

The array of lasers comprises a number of independently addressable lasers 7. Each laser has a separate contact pad 3 from which current is injected into the laser. Each laser is designed to operate at a different lasing wavelength, by, for example, varying the grating pitch in the laser or adjusting the effective index of the optical mode through varying the stripe width or the thickness of the layers that compose the laser. When current is injected into the laser using for example contact pads 3, the laser emits radiation with a specific wavelength and from a particular position on the chip, as represented by the arrows 9. In one embodiment, one laser is operated at a time, depending on the desired wavelength. The radiation or light from the lasers is transmitted to a micro-mechanical optical switch or switching element 11. The switching element has a number of states. In each particular state of a set of states, one of the input optical beams, i.e., light from one of the lasers, is transferred to the output 13 and transferred to the output fiber 15. The entire assembly is packaged together on one submount 19.

The fabrication of multi-wavelength laser arrays is relatively well known in the art. To assign different wavelengths to each laser, a number of techniques can be used, such as directly-written gratings with electron beam lithography, stepping a window mask during multiple holographic exposures, UV exposure through an appropriately fabricated phase mask, or changing the effective index of the mode of the lasers. Generally, for stable single mode characteristics, either a controlled phase shift is also included in the laser or gain/loss coupling is used in the grating. The wavelength of such lasers can be accurately controlled through dimensional variables, and varied across the array.

Figure 2:
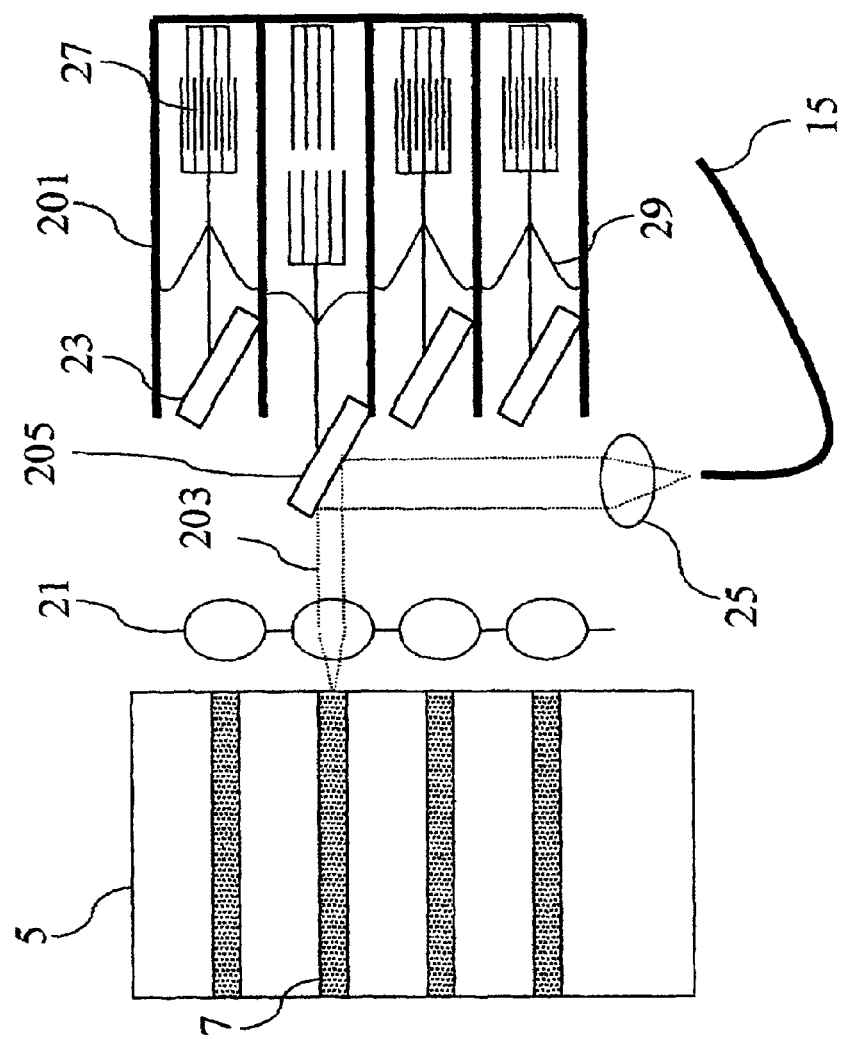
FIG. 2 illustrates another embodiment of an optical transmission apparatus having a micro-lens array used to collimate the beams from the laser array and one particular beam is selected by an array of movable mirrors.

The switching element 11, in one embodiment, comprises multiple mirrors that intercept each input optical beam and deflect the optical beam to an optical output. As such, to select a particular laser, the appropriate mirror is adjusted to receive and deflect the optical beam to the optical output. FIG. 2 illustrates one such switching element with a laser array 5. A set of microlenses 21 is provided to collimate diverging beams from the laser elements of the laser array to form a collimated beam 203. The switch or switching element 201 comprises an array of mirrors 23 that are individually positionable. The mirrors are retracted by electrostatic comb actuators 27 and pushed forward by springs 29. In another embodiment, the mirrors are pushed forward by springs 29 and retracted by electrostatic comb actuators 27. A particular mirror is positioned to deflect the collimated beam from a corresponding laser of the array of lasers. A single lens 25 focuses the deflected and collimated beam into an output fiber 15. The switch is a 1:N switch and, in various embodiments, is manufactured using surface micromachining, deep silicon etching, or other processes. The actuation mechanism, the actuators and/or springs, can be electrostatic, as shown, but are thermal or magnetic in other embodiments.

Thus, in one embodiment, a current is provided to a laser element of the laser array, e.g., laser element 7, and thereby the laser element emits light. A mirror of the array of mirrors, e.g., mirror 205, that corresponds to the selected laser element is identified. As such, the springs coupled to the corresponding mirror pushes the mirror forward. In one embodiment, the mirror is pushed past an initial position occupied by the other mirrors or pushed out of the switching element 201. The light from the laser element is collimated by a corresponding microlens and strikes the actuated mirror. The mirror reflects the light to the lens 25 which focuses the light into the optical fiber 15. Once the light from the laser element is no longer needed, the mirror is retracted by the actuators.

In one embodiment, the mirror is retracted when another laser element is selected. When another laser element is selected, the corresponding mirror is identified and positioned to cause the light from the selected laser element to be directed into the optical fiber. Any mirror not used to direct the light from the selected laser element to the fiber is positioned so as not to obstruct the optical path of the light from the selected laser element to the corresponding mirror and to the optical fiber.

The free-space method described above in reference to FIG. 2 may require considerable alignment, especially if the mirrors are non-uniform and the direction of deflection from the mirrors is not reliably reproducible. In this case, each beam should preferably be aligned independently.

Figure 3:
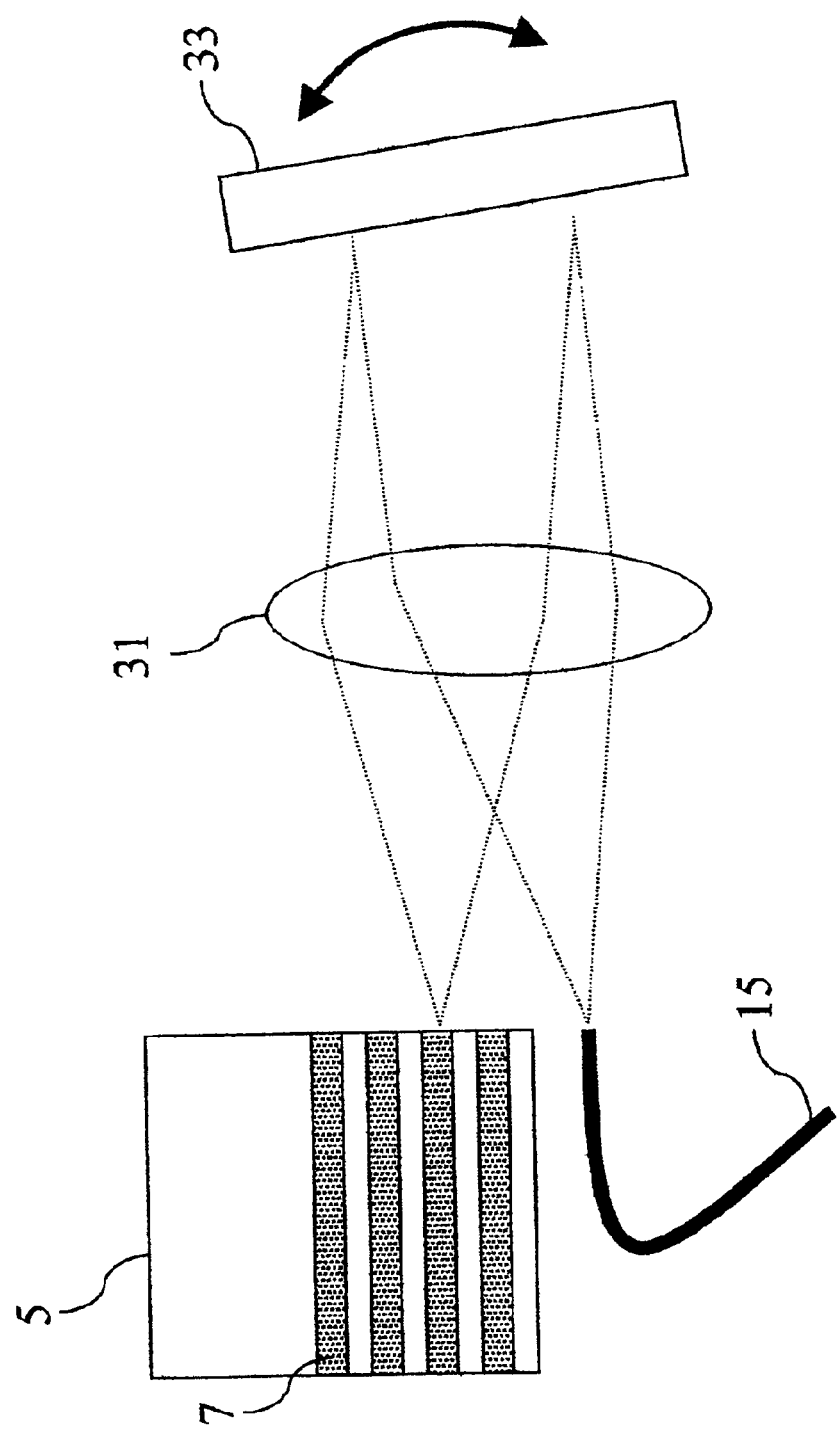
FIG. 3 illustrates another embodiment of an optical transmission apparatus having a tilting mirror where a single lens acts both to collimate and focus the beam.

FIG. 3 illustrates a further embodiment in accordance with the invention. In FIG. 3, an optical beam from a particular laser element 7 of the laser array 5 is collimated with a fixed lens 31. The light beam from the laser is initially diverging and is collimated by the fixed lens. The collimated beam from the fixed lens strikes a movable mirror 33. The movable mirror is nearly perpendicular to the beam, close to normal incidence, and reflects the beam back to the lens. The lens receives the reflected light beam and focuses the beam into an output fiber. In one embodiment, the fiber is positioned to receive the light at a location approximate the laser array, and in a direction substantially parallel to laser elements forming the laser array. In some embodiments optical isolators are positioned in the optical path to avoid reflections back into the lasers, which may have deleterious effects.

The fabrication of micro-mechanical tip/tilt mirrors, such as the mirror 33, are well known in the art. Both surface micromachining techniques and bulk silicon etching have been used to make such mirrors. In general, the precision required for the present invention is considerably less than that of large cross connect switches, as the beams travel a few millimeters, when the embodiments described herein are packaged in standard butterfly packages, rather than tens of centimeters in the switches. Thus, both the flatness and the pointing requirement for the optical apparatus are considerably reduced.

In the described embodiments, the output fiber is placed laterally to the laser array, such that at different angles of the mirror, the light from different laser elements are directed to the fiber. In other embodiments, the fiber is situated slightly above or below the laser array, with the mirror tilted slightly in another dimension, so that the reflected beam focuses onto the fiber. Also, although the fiber is shown to be the same distance away from the lens as the laser array, the two distances can be varied such that the system has non-unity magnification. Additionally, the fiber, in one embodiment, is a lensed fiber. The lensed fiber provides better coupling to a semiconductor source, e.g., a laser, with an optical system of unity magnification. Also, in one embodiment, instead of the convex lens 31, a graded refracted index (GRIN) lens is used.

When a different laser element is selected, the lens is moved to a different position to optimize the fiber coupling of the light beam from the laser element selected into the optical fiber. In one embodiment, the position of the lens is controlled by a servo loop, such that the fiber coupled power is always maximized. Active alignment in such a system can be avoided if the lens 31 (FIG. 3) or lens 21 (FIG. 2) is moved in two dimensions. As such, the servo loop can be optimized both in the lateral and vertical position of the lens for maximum coupling. Typically, these two positions are the most sensitive alignment parameters. In one embodiment, all the components could be soldered in a package using a coarse pick-and-place machine, and the servo loop is maintained optimum alignment, obviating the need for operator-assisted active alignment.

Figure 3A:
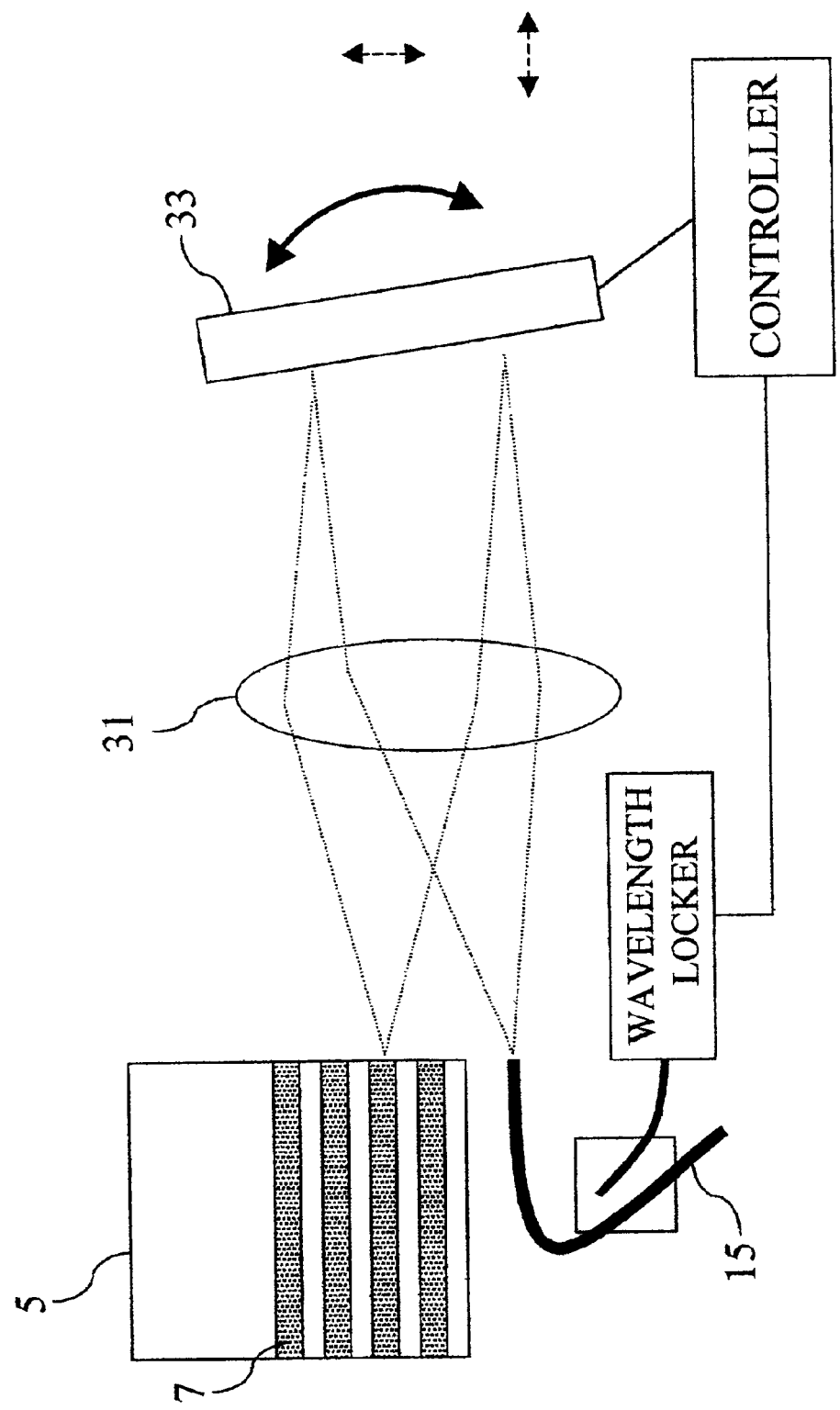
FIG. 3A illustrates one embodiment of an optical transmission apparatus of FIG. 3 having a servo control loop.

FIG. 2A and FIG. 3A illustrate such embodiments. In FIGS. 2A and 3A, a wavelength locker is coupled to the fiber by a tap. In other embodiments, the wavelength locker is inline with the fiber. The wavelength locker determines the strength or power of light transmitted at the fiber, and provides a signal indicative of the signal strength to a controller. In another embodiment, the light from the tap is provided to a photodetector. The photodetector produces a signal that is proportional to the output power of the light from the tap. For example, the output of the photodetector is summed by a summer. The output of the summer is an output indicator and is provided to the controller. The controller adjusts the mirror (for the embodiment of FIG. 3A) or selects a mirror (for the embodiment of FIG. 2A) based on previous signals provided by the wavelength locker or an initial calibration.

For instance, for the embodiment of FIG. 3A the controller maintains a lookup table of mirror positions in conjunction with the selection of each of the lasers in the laser array. Based on the values in the lookup table, the controller determines which direction the mirror should be moved to provide optimal output power. Thus, as appropriate, the controller produces a control signal to move the mirror along, for example, a first axis or a second axis, with the second axis being perpendicular to the first axis. The mirror, in one embodiment, is continually commanded to wander and the output power monitored to compensate for movement of components of the package, thermal effects and other causes of potential misalignment and thereby provide maximum output power. These and other control systems for controlling system output power are further described in the commonly assigned patent application entitled Laser and Fiber Coupling Control, filed of even date herewith, the disclosure of which is incorporated by reference.

Although FIGS. 1–3 show the laser element or stripe perpendicular to the facet, this need not necessarily be so. In DFB lasers, where the feedback into the cavity comes from the grating and not the facet, device performance improves with an angled facet. Angling the stripe relative to the facet reduces the effective reflectivity of the facet and prevents instabilities in the mode structure of the laser. To use angled facets, where all the laser stripes are at an angle, the semiconductor chip is tilted with respect to the rest of the optics, but the optical paths remain relatively unchanged.

Figure 4:
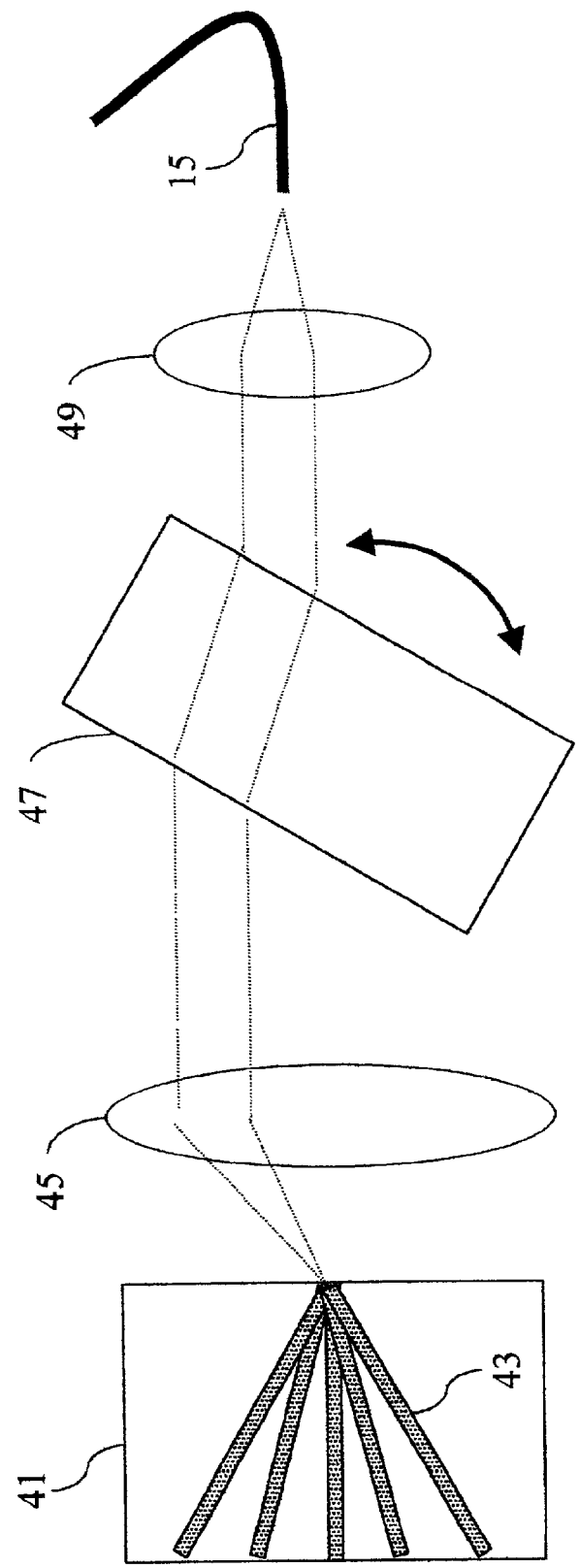
FIG. 4 illustrates another embodiment of an optical transmission apparatus where the lasers in a laser array are not made parallel to one another, but at varying angles.

In this case, the first lens causes the beams from the different lasers to be collimated, parallel and shifted with respect to each other. In FIG. 4, the laser array chip 41 comprises a number of different laser elements 43, all angled or tilted with respect to one another. As such, each laser element emits an optical beam at a different angle. A particular laser element is selected and the optical beam emitted is incident on a collimating lens 45. Since the beam originates from the focal point of the lens, the beam is collimated and redirected parallel to the optical axis of the lens. As such, the beams from each of the lasers are collimated and are parallel to each other, but shifted vertically. An optical element 47 shifts the beams back into the center of the optical axis to fall upon a focusing lens 49 and coupled to the output fiber 15. The optical element, in one embodiment, is a solid high index block that shifts the image, and is moveable to allow for correct selection of the output from a particular laser of the laser array. In various other embodiments, other components are used to shift the beam laterally, such as two mirrors with a fixed angle to each other and rotated simultaneously, or a wedge that is inserted into the paths of the optical beams and moves linearly into the beams.

There are many other modifications and variations that follow the embodiments described in reference to FIGS. 1–4. For example, the laser array itself could be moved laterally to change the coupling into the fiber. Alternatively, the fiber could be moved. Generally, moving larger objects, such as the laser array or the fiber, requires more force. As such, piezoelectric transducers or set screws are employed in various embodiments.

Figure 5:
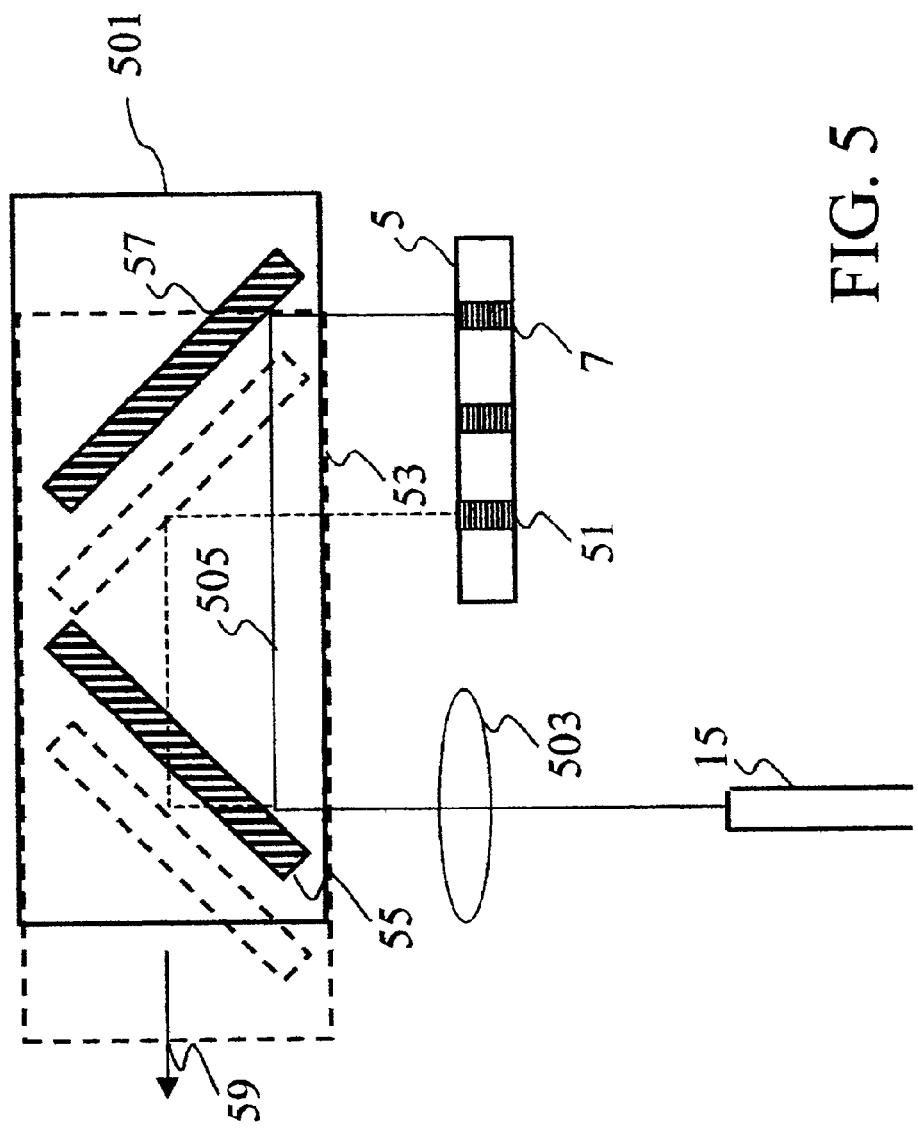
FIG. 5 illustrates another embodiment of an optical transmission apparatus with a movable optical element.

In FIG. 5, one embodiment of an optical apparatus using a linearly translatable element to couple light from a selected laser to an optical output, e.g., a fiber, is shown. In the described embodiment, the translatable element is an optical element 501. The optical element, in one embodiment, is a silicon component with volume removed from one side to form two opposing angled sides. The two opposing angled sides are coated with a reflective substance, forming mirrors 55 and 57. The two angled mirrors couple a light beam 505 from one laser element or stripe 7 from an array of laser stripes 5 via a lens 503 into a fiber 15.

In operation, the optical element is translated in a direction that is perpendicular to the length of the array of laser stripes to couple light from another laser stripe, e.g., laser stripe 51, to the fiber. The mirrors, in the embodiment described, are separate. However, in another embodiment, the mirrors are two sides of a prism. For example, the prism may resemble the shape of the material removed from the optical element, with the exterior of the angled sides coated with a reflective material depending on the extent of the internal reflection of the prism. In another embodiment, the mirrors are mounted on a common movable element or separately provided on a moveable element but commonly coupled together.

In one embodiment, the distance of translation of the optical element or the moving mirrors is half the separation of the laser stripes at the ends of the array. For example, if there are 10 lasers on a 10 micron pitch, the distance between the end stripes is 90 microns and thus, the range of travel of the moving mirrors is about 45 microns. The length of the array also determines the minimum size of the mirrors. In one embodiment, the projected length of the mirror on the array is at least half the length of the array. Using the above example again, the projected length of the mirror is about at least 45 microns. With a 45 degree angle as drawn, the actual width of the mirror is about 45 microns divided by the sin of 45 degrees, or about 64 microns. Thus, the mirrors or prism can be very small.

For dynamic coupling, it may be beneficial to control the position of the beam in the direction perpendicular to the plane of the laser array. This may be useful in the event the laser stripes do not generate parallel beams, the alignment of the fiber is not parallel to the alignment of the laser stripes, or other factors. Therefore, in one embodiment, the element is also rotatable about an axis formed along a line of the linear translation. In another embodiment, one or more additional moving two-mirror or prism assembly are used. The range of movement in many cases is less in the out-of-plane direction than in the in-plane direction described above.

Figure 6:
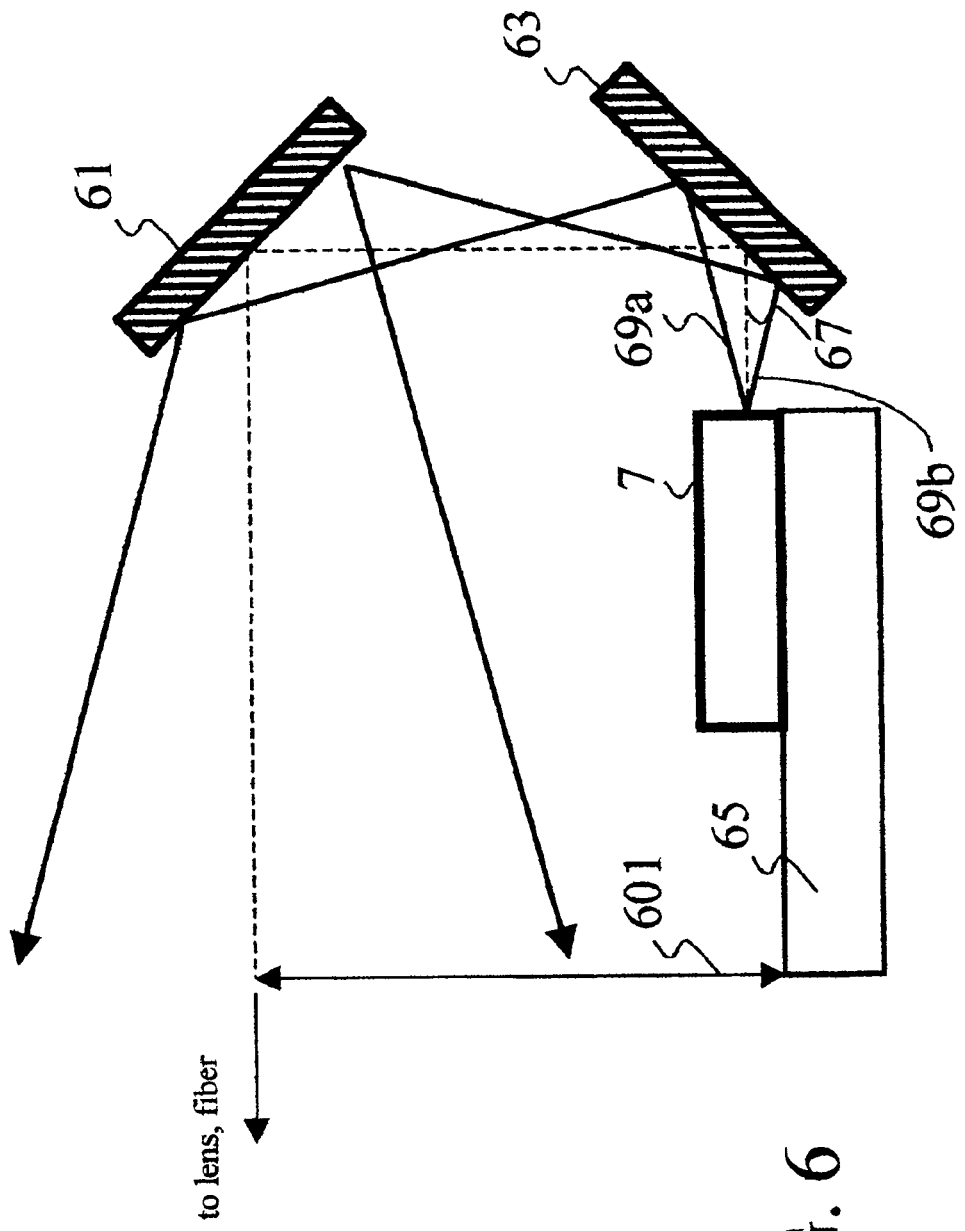
FIG. 6 illustrates a side view of the optical transmission apparatus illustrated in FIG. 5.

If the optical or light beam is deflected over the chip containing the laser array, the clearance or separation between the chip and the fiber should account for the angular divergence of the beam. This issue is illustrated in FIG. 6 using a side view of an optical apparatus. As illustrated, a light beam 67 is emitted from a laser stripe 7 mounted on a submount 65. The light beam is reflected back by two mirrors 61 and 63. The emitted light beam has a certain vertical divergence angle, as illustrated by arrows 69a and 69b which may be up to 60 degrees. As such, in order to avoid the loss of light, vertical separation 601 from all components of the chip or package to the center of the light beam out to an optical output is sufficiently large to compensate for the divergence angle of the light beam. In one embodiment, the separation is similar to the length of the submount, on the order of a few millimeters. Additionally, in order to maintain optimal coupling of the light beam into the fiber, the mirrors are moved simultaneously, in a similar manner, as previously described in reference to FIG. 5.

Figure 7:
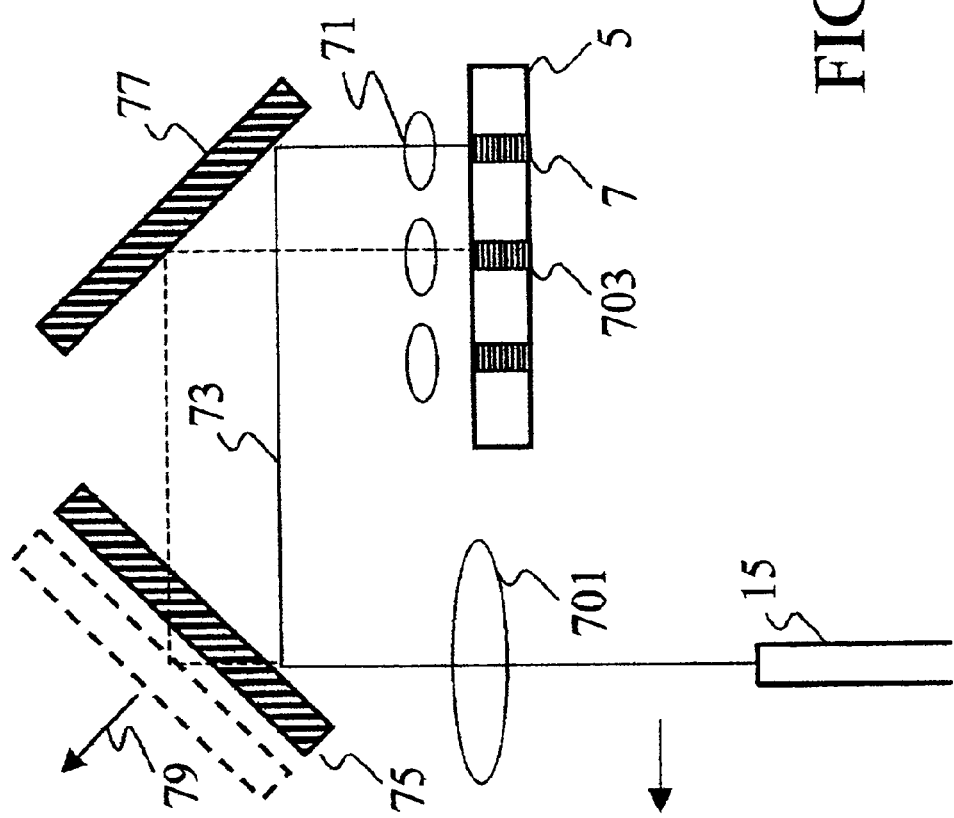
FIG. 7 illustrates another embodiment of an optical transmission apparatus with at least one movable mirror.

In FIG. 7, laser stripe selection is achieved in another embodiment by movement of either mirror 75 or mirror 77, thereby simplifying the mounting or fabrication of the moving mirror. As such, one of the mirrors remains fixed. In this embodiment, the optical path length to the fiber is different for each laser stripe, so different optics are used to ensure that the light is always adequately focused. The two angled mirrors 75 and 77 are used to couple a light beam 73 from a laser stripe 7 of the array of lasers 5 via lenses 71 and 701 into an optical output 15. The mirror 77 is translated in a direction 79 to select another laser stripe, e.g., laser stripe 703. The movement of the moving mirror can be in the direction shown, perpendicular to the plane of the mirror, or in other directions, for example, parallel to or perpendicular to the direction of the light beam incident upon it. Also, in one embodiment, the moving mirror is mounted on a moving actuator or in other embodiments, the moving mirror is a moving element itself, for example, a micro-machined silicon actuator with a reflective coating. The lenses 71 collimates a light beam from a laser stripe, so that the second lens 701 focuses the light into the optical output 15 independent of the varying optical path between the two lenses. In another embodiment, the mirror 705 is the moving mirror and the mirror 703 is fixed. In the optical apparatuses described in reference to FIGS. 5–7, the total optical path length to the fiber from the exit facet of the laser is constant no matter which laser stripe is selected, such that the fiber and any focusing lens or lenses can remain stationary while maintaining optimum coupling.

In further aspects of the embodiments already described, fiber coupling is dynamically controlled through a feedback loop, such as previously described or described in the aforementioned patent application Laser and Fiber Coupling Control. Electronic control of fiber coupling reduces the cost of the active alignment step as well as enables an electronically selectable functionality.

Figure 8:
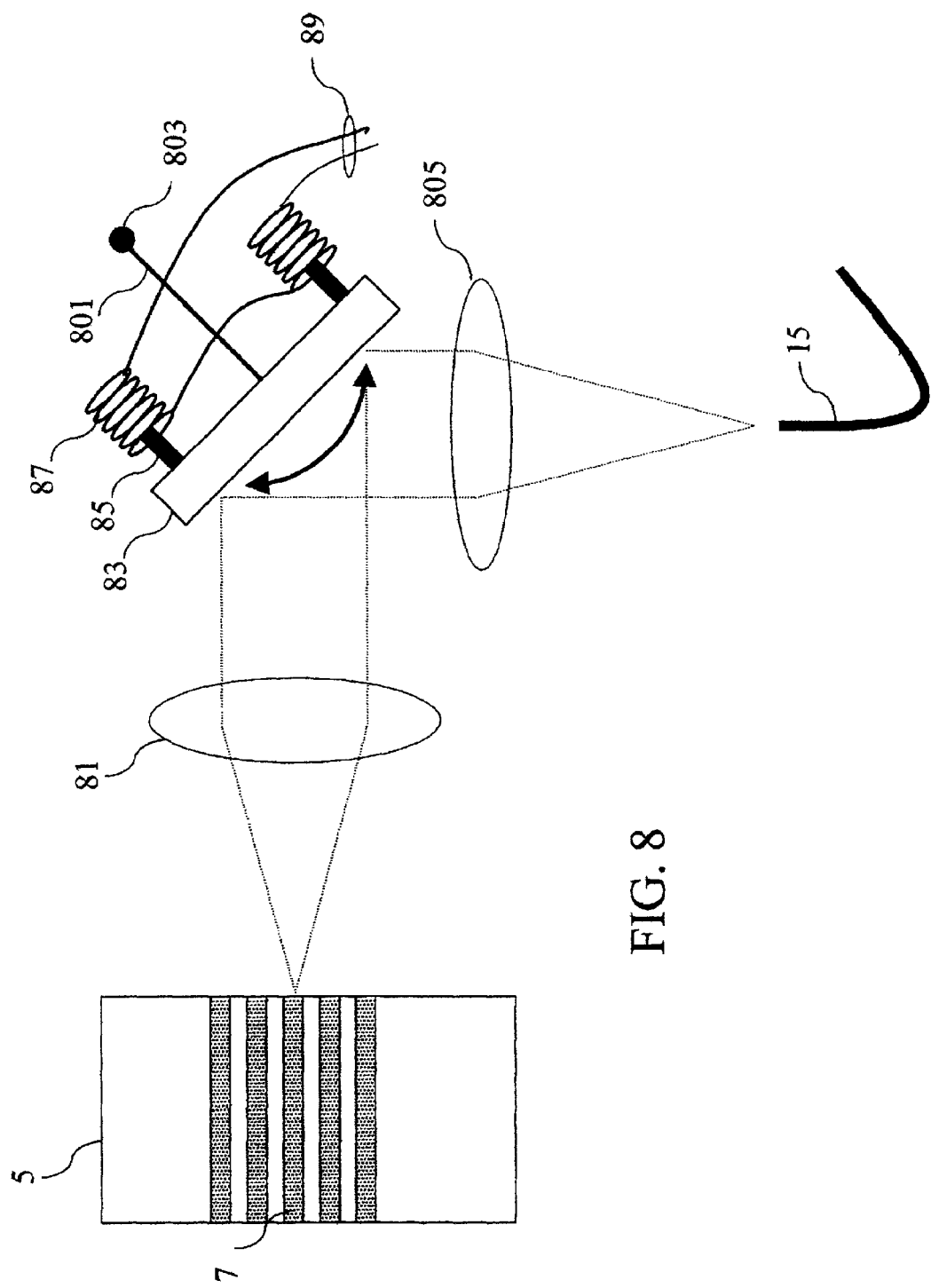
FIG. 8 illustrates another embodiment of an optical transmission apparatus in which light is provided to a fiber via a movable element being dynamically controlled.

FIG. 8 shows a schematic of one embodiment of an optical system with a magnetic control element. In the diagram a laser array chip 5 comprises a number of different laser elements 7, each of which has a different set of characteristics. Depending on the system requirements, the light from one particular laser element is used and directed by the optical train to an output fiber 15. In particular, the light from the laser element is collimated by a fixed focusing lens 81 and impinges on a mirror 83 whose angle is varied electronically. Once reflected from the mirror, the light is focused by a second lens 805 and is coupled to the output fiber. The mirror's rotation angle is adjusted both to select the beam of a particular laser, and also to maintain the optimal coupling to the optical output. In this particular schematic, the tilting mirror is shown to be moved magnetically. Two magnets 85 attached to the rear of the mirror are positioned with solenoids 87. A control current applied through wire 89 controls the magnetic field which pulls one magnet into the solenoid and pushes the other magnet out. Together with a fixed pivot point 803 and a spring 801, the angle of the mirror is controlled using the control current. In addition to magnetic fields, electro-static, thermal, piezoelectric, or any variety of techniques are used to control the position of the optical elements, and thereby influence the optical coupling in various embodiments. Also, in various embodiments motion occurs in more than one dimension. For example, the mirror tilts in another direction, i.e., out of the plane of the drawing. The lenses in one embodiment are also positionable along the direction of the optical axis for optimal focus.

Figure 9:
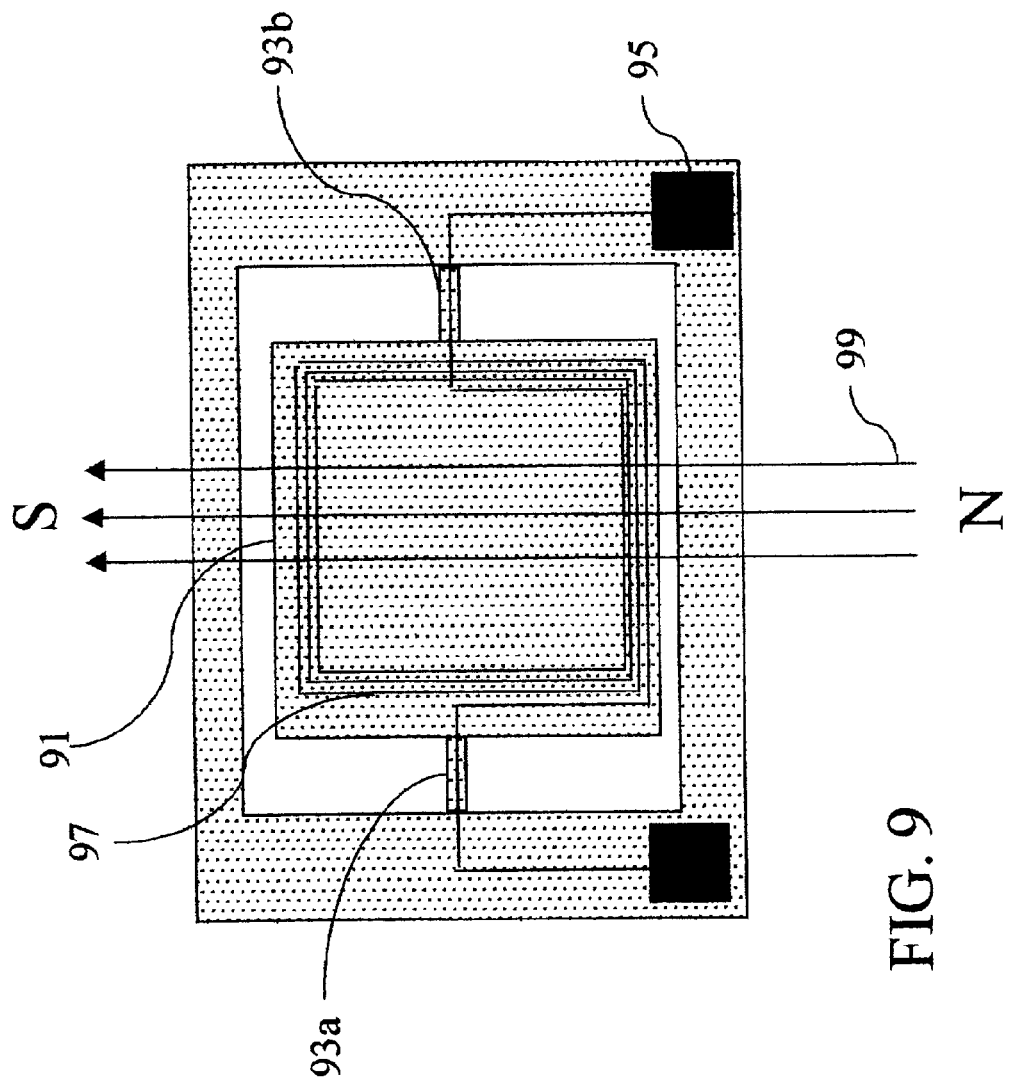
FIG. 9 illustrates one embodiment of a moveable mirror.

An alternative magnetically induced actuator is shown in FIG. 9. A micro-mirror 91 is restrained by two hinges 93a,b on either sides of the micro-mirror. Patterned on the surface is a coil 97. The coil generates a magnetic field when an electric current is passed between contacts 95. The micromirror is placed in a constant external field 99, such that the interaction between the two fields torques the mirror about the two hinges. Such galvanic mirrors are commonly fabricated in the art. Together, with electrostatic actuation in the other direction, they can be used to deflect the optical beams from an array of lasers and select a single beam to be coupled to a fiber. Additionally, the mirror 91, for example, could be fabricated out of or contain a magnetic material such as nickel. As a result, no lithographically produced coils would be needed. The deflection angle can be controlled by varying the strength of the external magnetic field produced by an electro-magnet.

Figure 10:
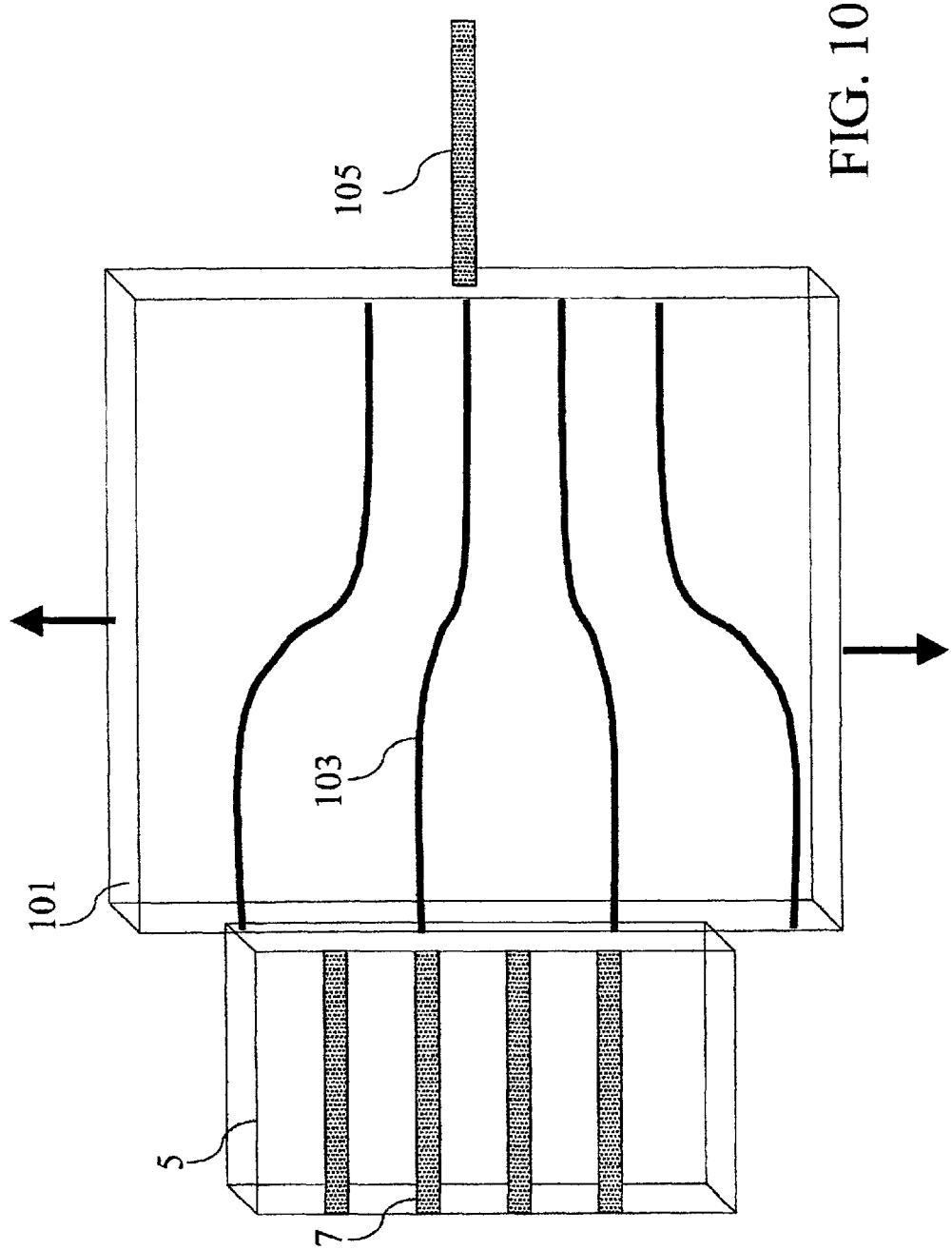
FIG. 10 illustrates one embodiment of an optical transmission apparatus in which light is provided to a fiber via a sliding waveguide.

Another embodiment shown in FIG. 10 utilizes a sliding waveguiding layer to select the output of a particular laser to be coupled to the fiber. A laser array 5 contains a number of laser elements 7. The array is coupled to a planar waveguide chip 101 that has a series of curved waveguides 103 lithographically patterned into the chip. In various embodiments the waveguides are constructed using silicon-on-silicon technology, or more preferably silicon-on-insulator (SOI) technology. The entire section of curved waveguides is configured to move laterally. Various other displacement mechanisms, including those discussed herein, may also be used.

On the other side of the movable planar waveguide section is an output waveguide 105, e.g., an optical fiber. As the sliding waveguide section 101 moves laterally, a different curved waveguide connects one laser element of the laser array to the output waveguide. Thus a tunable source can be realized by selecting a laser of an appropriate wavelength, and then translating the sliding waveguide section such that the selected laser's output is coupled to the output waveguide.

Figure 11:
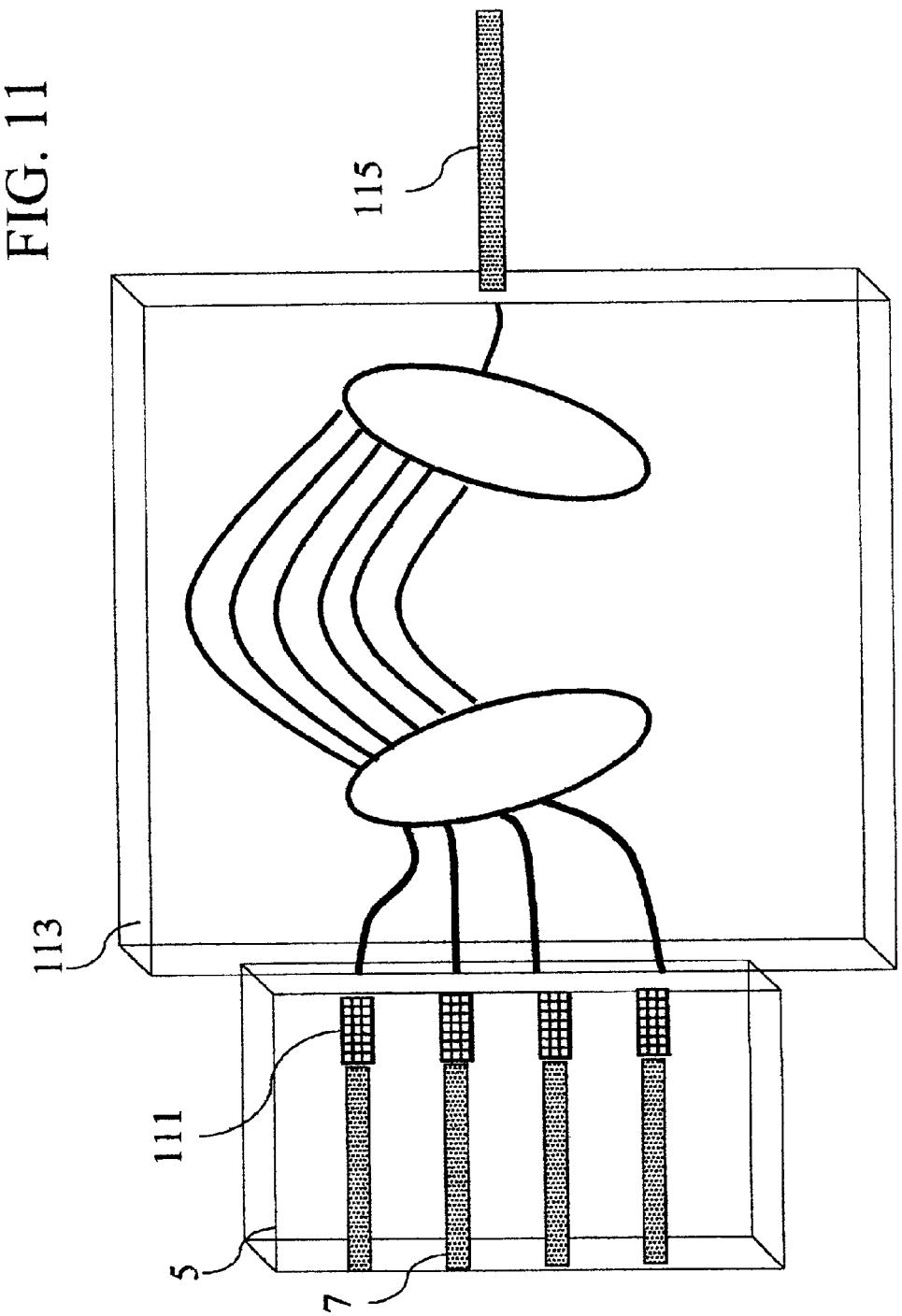
FIG. 11 illustrates another embodiment of an optical transmission apparatus in which light is provided to a fiber via a selective multiplexer.

Another embodiment not utilizing any switching is shown in FIG. 11. In the embodiment shown, the planar waveguide includes a wavelength selective component 113, such as an arrayed waveguide grating (AWG). Such a component combines light of different wavelengths into a single output with minimal loss. For example, in one embodiment an AWG is provided by coupling a pair of couplers by a differention grating comprised of unequal length waveguides. Appropriately varying the length of the waveguides for input beams of predetermined wavelengths, and appropriate design of the couplers, allows for a plurality of input beams to be coupled to a single output.

As previously described, a laser array 5 contains lasers of different wavelengths, e.g., laser element 7. The wavelength selective component or multiplexer includes a series of wavelength channels. Each wavelength channel corresponds to a particular laser having a particular wavelength. As all the wavelength channels of the multiplexer are aligned to the laser array, all the beams from each laser element can be combined simultaneously into the optical output 115.

Therefore, not only can a single channel be chosen to have a variable wavelength output, but all the lasers can be switched on and used simultaneously to provide all the channels of a WDM communication node. To provide the signals, the lasers can be modulated directly or, in one embodiment, integrated electroabsorption modulators 111 are fabricated in the chip. Although a separate wavelength selective multiplexer is shown, such devices are readily fabricated in InP and the entire assembly, lasers, modulators and a AWG, can be integrated together. However, for thermal tuning of the device, the temperature dependent characteristics of the multiplexer 113 should be carefully matched to that of the laser array, so that the wavelength of the lasers and the pass characteristics of the AWG move together. Additionally, when all the lasers are operated simultaneously, thermal cross talk between the lasers should be minimized by, preferably, spacing the lasers apart. Also the radio frequency cross talk radiated and capacitively coupled between the lines should be minimized.

Figure 12:
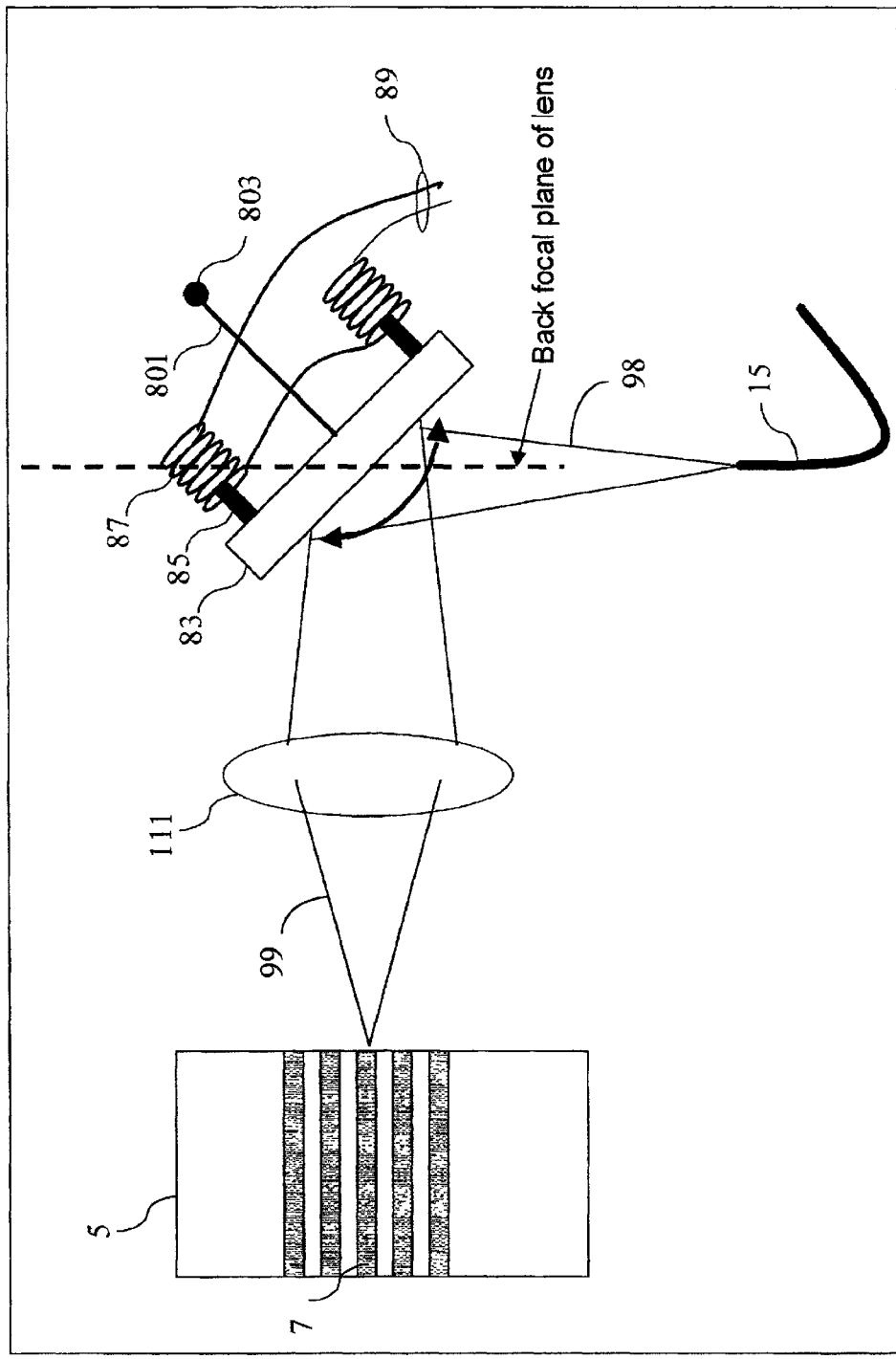
FIG. 12 illustrates a further single lens embodiment in accordance with aspects of the present invention.

FIG. 12 illustrates single-lens imaging embodiment 1200 of the present invention in which a single lens 81 is employed to both collimate and focus optical beam 99 from particular lens element 7 of laser array 5 onto mirror 83. In this embodiment, it is desirable to select the magnification of lens 81 to maximize optical beam coupling efficiency into fiber 15. Also, by placing mirror 83 in the back focal plane of lens 111, which in one embodiment is a single collimating-focus lens, the mirror size and deflection range that can be used in single-lens imaging embodiment 1200 would be approximately the same as would be used in a functionally-comparable collimated beam imaging embodiment, provided the effective focal length for the imaging lens is approximately that of the collimating lens. Furthermore, by positioning mirror 83 near the back focal plane of lens 81, the axis of the cone of light 98 focused on fiber 15 becomes substantially parallel to the axis of fiber 15, thereby substantially maximizing the coupling efficiency. The smaller size of single-lens imaging embodiment 1200 can be advantageous, for example, where it is desirable to include, for example, a semiconductor or a modulator with the single-lens imaging device.

Although substantially mechanical beam steering techniques are primarily discussed above, in various embodiments other beam steering techniques are used. Such embodiments include, without limitation, electro-optic (EO) and acousto-optic (AO) beam steering techniques. Although mechanical steering devices may provide relatively high resolution, they can be slow, relative to EO and AO beam steering devices, which may be at least an order of magnitude faster. In addition, EO and AO deflectors essentially lack moving parts, thereby rendering designs incorporating these devices more robust.

Figure 13:
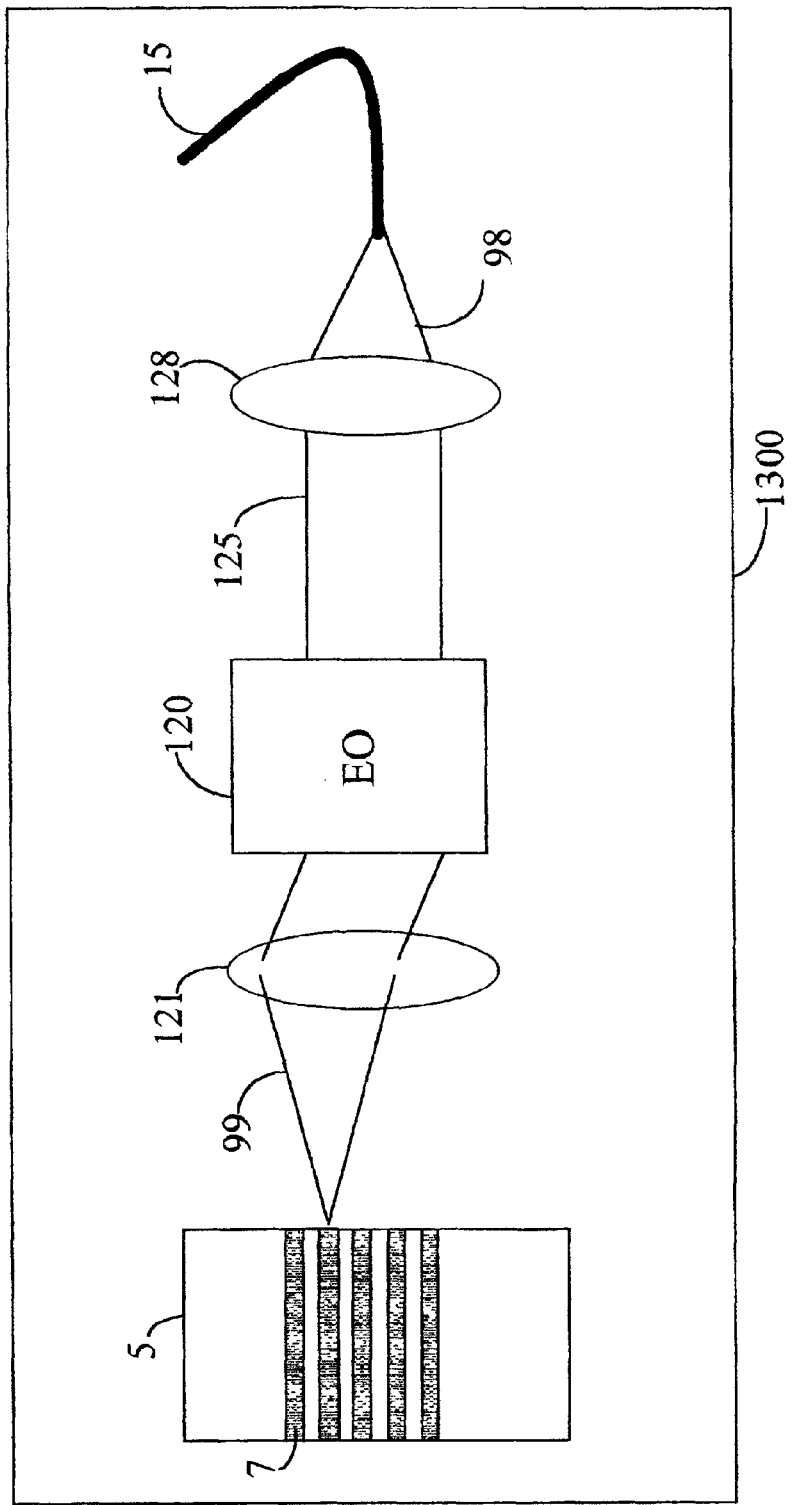
FIG. 13 illustrates a further embodiment using an electro-optic beam steering element.

FIG. 13 illustrates an EO deflector embodiment 1300 of the present invention, in which EO deflector 120 is used to steer the optical beam. As in previous embodiments, optical beam 99 from particular lens element 7 of laser array 5 is collimated with fixed lens 121, and then transmitted to EO deflector 120 which steers collimated beam 125 to the focusing lens 128. Focusing lens 128, in turn, directs the axis of the cone of light 98 to be focused on, and maximally coupled to, fiber 15. A electro-optic modulator exhibits a predetermined amount of birefringence upon application of a voltage to a suitable crystalline material producing the birefringent effect. Although some materials are known to be naturally birefringent, others become birefringent only when a voltage is applied, thereby allowing for the presence and degree of birefringence to be controlled. Examples of suitable materials include, without limitation, barium sodium niobate, lithium niobate, potassium dihydrogen phosphate, ammonium dihydrogen phosphate, and nitrobenzene. Although the crystalline material may be provided in different structures, in the present embodiment, it is desirable that a prism be used as the EO modulator. The predetermined applied voltage alters the index of refraction of the prism by a predetermined amount, thereby selectively altering the propagation direction of a beam therethrough.

Figure 14:
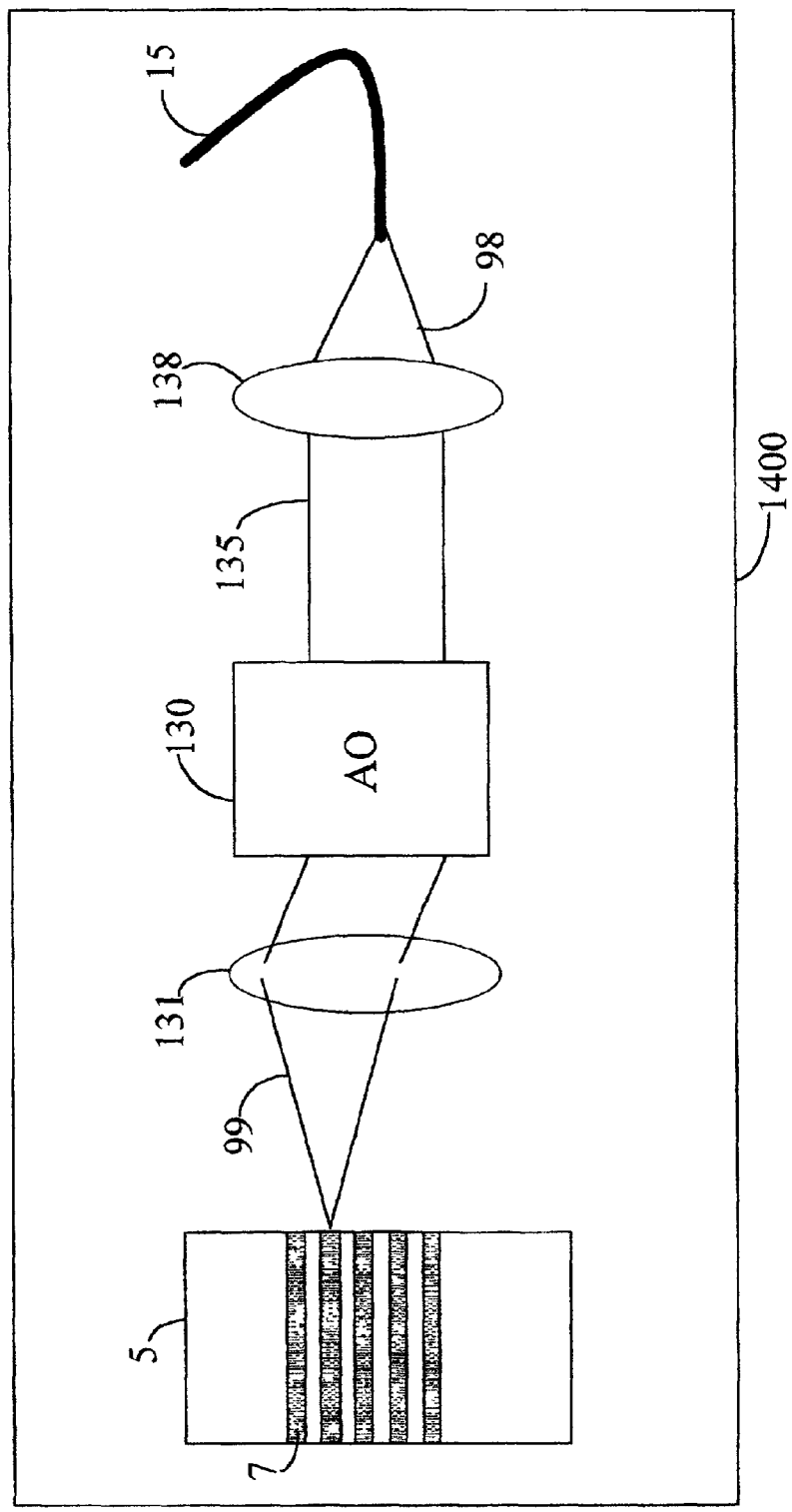
FIG. 14 illustrates a further embodiment using an acousto-optic beam steering element.

FIG. 14 illustrates an AO embodiment 1400 of the present invention, in which AO deflector 130 is used to steer the optical beam. As in previous embodiments, optical beam 99 from particular lens element 7 of laser array 5 is collimated with fixed lens 131, and then transmitted to AO modulator 130, which steers collimated beam 135 to the focusing lens 138. Focusing lens 138, in turn, directs the axis of the cone of light 98 to be focused on, and maximally coupled to, fiber 15. Typically in an AO deflector, an optical beam is diffracted by a column of sound passing through a suitable AO medium. An acousto-optic interaction occurs in an optical medium, for example, when an acoustic wave and a laser beam are present in the medium. When an acoustic wave is launched into the optical medium, it generates a refractive index wave that behaves like a sinusoidal grating. In general, it is desirable to couple a piezoelectric transducer to the AO medium, because a predetermined voltage applied to such a transducer can generate an acoustic wave with selectable characteristics causing a predetermined deflection of the optical beam passing through the selected AO material. Materials commonly used for visible light and near-infrared regions can include dense flint glass, tellurium oxide, chalcogenide glass or fused quartz. In the infrared region, germanium can be used. For high frequency signal processing devices, for example, lithium niobate and gallium phosphide may be suitable. Relative to an EO deflector, an AO deflector tends to have less bandwidth but, at the same time, generally requires a lower operating voltage and demands less power.

The present invention therefore provides a tunable laser. Although the invention has been described with respect to certain specific embodiments, it should be recognized that the invention may be practiced otherwise than as specifically described. Accordingly, the invention should be considered as that defined by the attached claims and their equivalents, as well as claims supported by this disclosure.

What is claimed is:

1. An optical transmission apparatus comprising:
   an array of lasers;
   an optical output;
   an array of mirrors, each mirror being movable such that light from a laser from the array of lasers directed to a mirror of the array of mirrors is directed to the optical output;
   comprising an array of positioning elements, each positioning element coupled to a corresponding mirror of the array of mirrors wherein each positioning element is configured to move the corresponding mirror from a first position to a second position and from the second position to the first position; and wherein the positioning element comprises an actuator and a spring.

2. The optical transmission apparatus of claim 1 wherein a mirror in the second position directs light from a laser to the optical output.

3. The optical transmission apparatus of claim 2 wherein only one mirror of the array of mirrors is in the second position when light is directed to the optical output.

4. The optical transmission apparatus of claim 3 wherein a mirror in the first position does not direct light to the optical output.

5. The optical transmission apparatus of claim 1 wherein each spring is configured to move a mirror from a first position to a second position and each actuator is configured to move the mirror from the second position to the first position.

6. The optical transmission apparatus of claim 5 wherein the mirror in the second position directs light from a laser to the optical output.

7. The optical transmission apparatus of claim 6 wherein only one mirror of the array of mirrors is in the second position when light is directed to the optical output.

8. The optical transmission apparatus of claim 6 wherein a mirror in the first position does not direct light to the optical element.

9. An optical transmission apparatus comprising:
an array of single wavelength lasers on a semiconductor substrate, each laser emitting light at a specific wavelength as determined by dimensional variables of each laser;
a lens collimating light from a laser in the array of lasers;
an optical output; and
a moveabe mirror, the mirror not a diffractive grating, the mirror being moveable to receive the light collimated by the lens from any of a plurality of lasers in the array of lasers, the mirror reflecting the light back to the lens, which passes the light to the optical output.

10. The optical transmission apparatus of claim 9 wherein the mirror is movable about an axis perpendicular to the array of lasers.

11. The optical transmission apparatus of claim 10 wherein the lens is fixed.

12. The optical transmission apparatus of claim 9 wherein the optical output comprises a fiber.

13. The optical transmission apparatus of claim 9 wherein the optical output is adjacent the array of lasers.

14. The optical transmission apparatus of claim 9 wherein the array of lasers has an emitting end from which light is emitted and the optical output has a receiving end in which reflected light is directed into, such that the receiving end of the optical output and the emitting end of the array of lasers face in substantially the same direction.

15. An optical transmission apparatus comprising:
an array of single wavelength lasers on a semiconductor substrate, each laser emitting light at a specific wavelength as determined by dimensional variables, of each laser;
an optical output; and
a mirror, the mirror not a diffractive grating, moveable to reflect light at normal incidence from any one of a plurality of lasers in the array of lasers to the optical output.

16. The optical transmission apparatus of claim 15 wherein the mirror is movable about an axis perpendicular to the array of lasers.

17. The optical transmission apparatus of claim 15 wherein the optical output comprises a fiber.

18. The optical transmission apparatus of claim 17 further comprising a lens directing light into the fiber.

19. The optical transmission apparatus of claim 17 wherein the optical output is adjacent the array of lasers.

20. The optical transmission apparatus of claim 18 wherein the array of lasers has an emitting end from which light is emitted and the fiber has a receiving end in which reflected light is directed into, such that the receiving end of the fiber and the emitting end of the array of lasers both face in substantially the first direction.

21. An optical transmission apparatus comprising:
an array of lasers;
an optical output path for receiving light from a laser in the array of lasers; and
a moveable optical element with a portion of volume in the optical element evacuated to form a first reflective surface and a second reflective surface, the optical element moveable to reflect light from any one of a plurality of lasers in the array of lasers from the first reflective surface to the second reflective surface to the optical output path; and
wherein the optical element is moveable in a direction substantially perpendicular to the array of lasers.

22. The optical transmission apparatus of claim 21 further comprising a focusing lens, the focusing lens directing light to an optical output in the optical output path.

23. The optical transmission apparatus of claim 22 wherein the optical output is a fiber.

24. The optical transmission apparatus of claim 23 wherein the optical element is translatable in a direction substantially perpendicular to the fiber.

25. The optical transmission apparatus of claim 24 wherein the number of lasers in the array of lasers is proportional to lengths of the first and second reflective surfaces.

26. The optical transmission apparatus of claim 24 wherein the first and second reflective surfaces each have a length that is proportional to length of the array of lasers.

27. The optical transmission apparatus of claim 26 wherein the optical element is rotatable around an axis in which the optical element translates.

28. An optical transmission apparatus comprising:
an array of lasers;
a focusing lens;
a moveable platform;
a first mirror and a second mirror coupled to the movable platform, the first and second mirror being separated and angled in opposite directions relative to each other, such that the first mirror reflects light from at least one laser from the array of lasers to the second mirror that reflects light to a focusing lens;
wherein the first mirror is translatable in a first direction; and
wherein the first direction is substantially perpendicular to the array of lasers.

29. The optical transmission apparatus of claim 28 wherein the second mirror is translatable in a first direction.

30. The optical transmission apparatus of claim 29 wherein the first direction is substantially perpendicular to the array of lasers.

31. An optical transmission apparatus comprising:

an array of lasers;

an array of lenses, each lens in the array of lenses corresponding to each laser in the array of lasers, and collimating light from the corresponding laser;

a lens focusing light reflected by the second mirror into an optical output; and first mirror and a second mirror, the first mirror having a fixed position relative to the array of lasers and receiving collimated light from the array of lasers, the second mirror moveable to couple light reflected by the first mirror to the lens, with two opposite sloped sides, such that one mirror reflects light from at least one laser from the array of lasers to the other mirror that reflects light to the lens.

32. The optical transmission apparatus of claim 21 wherein the optical element comprises a prism.

33. The optical transmission apparatus of claim 31 wherein the mirrors are sloped in opposite directions of each other.

34. An optical transmission apparatus, comprising:

an array of single wavelength lasers on a semiconductor substrate, each laser emitting light at a specific wavelength as determined by a grating fabricated within each laser;

a lens positioned to focus an optical beam from the array of lasers;

an optical element moveable to receive the focused optical beam from one of the array of lasers and to direct the focused optical beam into an optical output path; and wherein the optical element is a moveable mirror, the lens has a back focal plane, and the mirror is disposed in the back focal plane of the lens.

35. The optical transmission apparatus of claim 34, wherein an optical axis of the focused beam of light is substantially parallel to an optical axis of the optical output path.

\* \* \* \* \*